United States Patent
Eichelberg et al.

(10) Patent No.: US 10,531,597 B1
(45) Date of Patent: Jan. 7, 2020

(54) NEGATIVE PRESSURE AIR HANDLING SYSTEM

(75) Inventors: John W. Eichelberg, Spokane, WA (US); Andrew Robert Schulz, Seattle, WA (US); Michael P. Czamara, Seattle, WA (US); Matthew T. Phillips, Seattle, WA (US); Alan D. Gillooly, Auburn, WA (US)

(73) Assignee: Amazon Technologies, Inc., Seattle, WA (US)

( * ) Notice: Subject to any disclaimer, the term of this patent is extended or adjusted under 35 U.S.C. 154(b) by 716 days.

(21) Appl. No.: 13/525,057

(22) Filed: Jun. 15, 2012

(51) Int. Cl.
| | |
|---|---|
| H05K 7/20 | (2006.01) |
| G06F 1/16 | (2006.01) |
| G06F 15/16 | (2006.01) |
| G06F 1/20 | (2006.01) |
| F25D 17/06 | (2006.01) |
| F25D 17/08 | (2006.01) |
| F25B 39/02 | (2006.01) |

(52) U.S. Cl.
CPC ......... *H05K 7/20709* (2013.01); *F25B 39/02* (2013.01); *F25D 17/06* (2013.01); *F25D 17/08* (2013.01); *G06F 1/16* (2013.01); *G06F 1/20* (2013.01); *G06F 15/16* (2013.01); *G06F 15/161* (2013.01); *H05K 7/20* (2013.01); *H05K 7/20009* (2013.01); *H05K 7/20136* (2013.01); *H05K 7/20536* (2013.01)

(58) Field of Classification Search
CPC . F25D 17/06; F25D 17/08; G06F 1/16; G06F 1/20; G06F 15/16; G06F 15/161; H05K 7/20; H05K 7/20009; H05K 7/20136; H05K 7/20536; H05K 7/20709; F25B 39/02

USPC ........... 361/679.48, 679.46–679.5, 695, 688; 62/89, 91; 165/104.33; 454/184
See application file for complete search history.

(56) References Cited

U.S. PATENT DOCUMENTS

| | | | |
|---|---|---|---|
| 6,034,873 | A | 3/2000 | Stahl et al. |
| 6,141,986 | A | 11/2000 | Koplin |
| 7,010,392 | B2 | 3/2006 | Bash et al. |
| 7,197,433 | B2 | 3/2007 | Patel et al. |
| 7,278,273 | B1 | 10/2007 | Whitted et al. |
| 7,511,959 | B2 | 3/2009 | Belady et al. |
| 7,701,714 | B2 | 4/2010 | Shabany |

(Continued)

FOREIGN PATENT DOCUMENTS

| | | |
|---|---|---|
| JP | 2007285082 | 11/2007 |
| WO | 2004083743 | 9/2004 |

OTHER PUBLICATIONS

International Search Report and Written Opinion in application No. 201201861-0 dated May 28, 2013 pp. 1-12.

(Continued)

*Primary Examiner* — Mukundbhai G Patel
*Assistant Examiner* — Zhengfu J Feng
(74) *Attorney, Agent, or Firm* — Robert C. Kowert; Kowert, Hood, Munyon, Rankin & Goetzel, P.C.

(57) ABSTRACT

A data center includes two or more rack computing systems and an air handling system. The rack computing systems may each include racks and computing devices mounted in the rack. The air handling system includes one or more air moving devices external to the one or more racks. The air moving devices create a negative pressure relative to ambient air at air inlets to the racks to draw air from the inlets and through computing devices in the racks.

34 Claims, 10 Drawing Sheets

(56) References Cited

U.S. PATENT DOCUMENTS

| | | | |
|---|---|---|---|
| 7,957,142 B2* | 6/2011 | Noteboom | H05K 7/20745 165/104.33 |
| 7,990,710 B2 | 8/2011 | Hellriegel et al. | |
| 8,077,457 B2 | 12/2011 | Gauthier et al. | |
| 8,141,374 B2 | 3/2012 | Hay | |
| 8,151,578 B1 | 4/2012 | Morales et al. | |
| 8,756,441 B1 | 6/2014 | Mullins et al. | |
| 2003/0067745 A1 | 4/2003 | Patel et al. | |
| 2005/0228618 A1 | 10/2005 | Patel et al. | |
| 2005/0235671 A1 | 10/2005 | Belady et al. | |
| 2006/0065000 A1 | 3/2006 | Belady | |
| 2007/0101746 A1 | 5/2007 | Schlom et al. | |
| 2007/0167125 A1 | 7/2007 | Rasmussen et al. | |
| 2007/0213000 A1 | 9/2007 | Day | |
| 2007/0274043 A1 | 11/2007 | Shabany | |
| 2008/0029250 A1 | 2/2008 | Carlson et al. | |
| 2008/0055846 A1 | 3/2008 | Clidaras et al. | |
| 2008/0055850 A1* | 3/2008 | Carlson | G06F 1/20 361/695 |
| 2008/0094797 A1 | 4/2008 | Coglitore et al. | |
| 2008/0158818 A1 | 7/2008 | Clidaras et al. | |
| 2008/0259566 A1 | 10/2008 | Fried | |
| 2008/0270572 A1 | 10/2008 | Belady et al. | |
| 2009/0046427 A1 | 2/2009 | Noteboom et al. | |
| 2009/0168345 A1 | 7/2009 | Martini | |
| 2009/0195977 A1 | 8/2009 | Fink et al. | |
| 2009/0207567 A1 | 8/2009 | Campbell et al. | |
| 2009/0210096 A1 | 8/2009 | Stack et al. | |
| 2009/0228893 A1 | 9/2009 | Behrendt et al. | |
| 2009/0229194 A1 | 9/2009 | Armillas | |
| 2009/0301123 A1 | 12/2009 | Monk et al. | |
| 2010/0057259 A1 | 3/2010 | Dawson et al. | |
| 2010/0082178 A1 | 4/2010 | Dawson et al. | |
| 2010/0091448 A1* | 4/2010 | Noteboom | H05K 7/20745 361/679.48 |
| 2010/0111105 A1 | 5/2010 | Hamilton et al. | |
| 2010/0144265 A1 | 6/2010 | Bednarcik et al. | |
| 2010/0154448 A1* | 6/2010 | Hay | H05K 7/20745 62/175 |
| 2010/0188810 A1 | 7/2010 | Andersen et al. | |
| 2010/0275441 A1 | 11/2010 | Rasmussen et al. | |
| 2010/0277863 A1 | 11/2010 | Tozer et al. | |
| 2010/0324739 A1 | 12/2010 | Dawson et al. | |
| 2011/0009047 A1* | 1/2011 | Noteboom | H05K 7/20745 454/184 |
| 2011/0029152 A1 | 2/2011 | Patel et al. | |
| 2011/0105010 A1* | 5/2011 | Day | 454/184 |
| 2011/0154842 A1 | 6/2011 | Heydari et al. | |
| 2011/0197612 A1 | 8/2011 | Campbell et al. | |
| 2012/0316695 A1 | 12/2012 | Chen et al. | |
| 2013/0019124 A1 | 1/2013 | Grimshaw | |

OTHER PUBLICATIONS

Office Action from Japanese Patent Application No. 2012-532222, dated Nov. 27, 2012 (English Translation and Japanese Versions), pp. 1-6.

International Search Report from PCT/US 10/50408 dated Jan. 26, 2011, pp. 1-9.

Office Action from U.S. Appl. No. 12/568,323, dated Jun. 20, 2013, Michael P. Czamara et al pp. 1-26.

Office Action from U.S. Appl. No. 12/568,323, dated Jan. 9, 2013, Michael P. Czamara et al pp. 1-8.

U.S. Appl. No. 12/491,941, filed Jun. 25, 2009.

U.S. Appl. No. 12/341,137, filed Dec. 28, 2008.

U.S. Appl. No. 11/956,849, filed Dec. 14, 2007.

U.S. Appl. No. 12/163,146, filed Jun. 27, 2008.

U.S. Appl. No. 12/568,323, filed Sep. 28, 2009, Michael P. Czamara et al.

U.S. Appl. No. 13/525,060, filed Jun. 15, 2012, John W. Eichelberg et al.

U.S. Appl. No. 13/525,053, filed Jun. 15, 2012, John W. Eichelberg et al.

U.S. Appl. No. 13/603,348, filed Sep. 4, 2012, Brock R. Gardner.

U.S. Appl. No. 13/603,341, filed Sep. 4, 2012, Brock R. Gardner.

U.S. Appl. No. 13/792,962, filed Mar. 11, 2013, John W. Eichelberg.

* cited by examiner

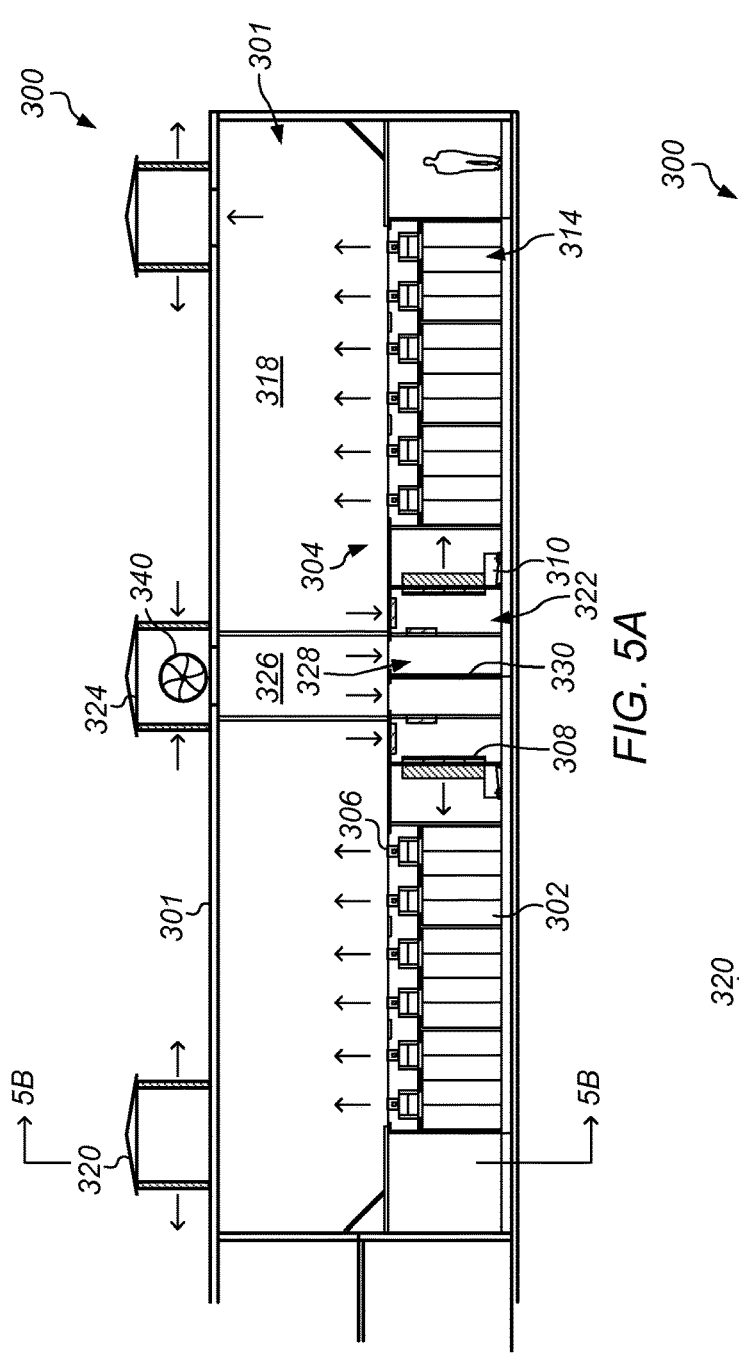
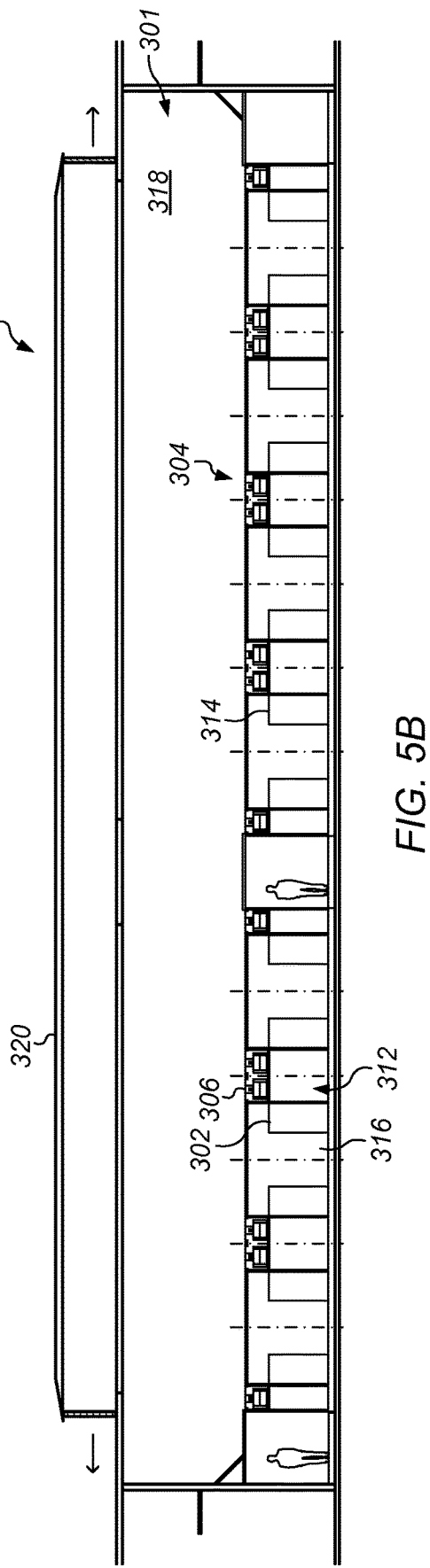

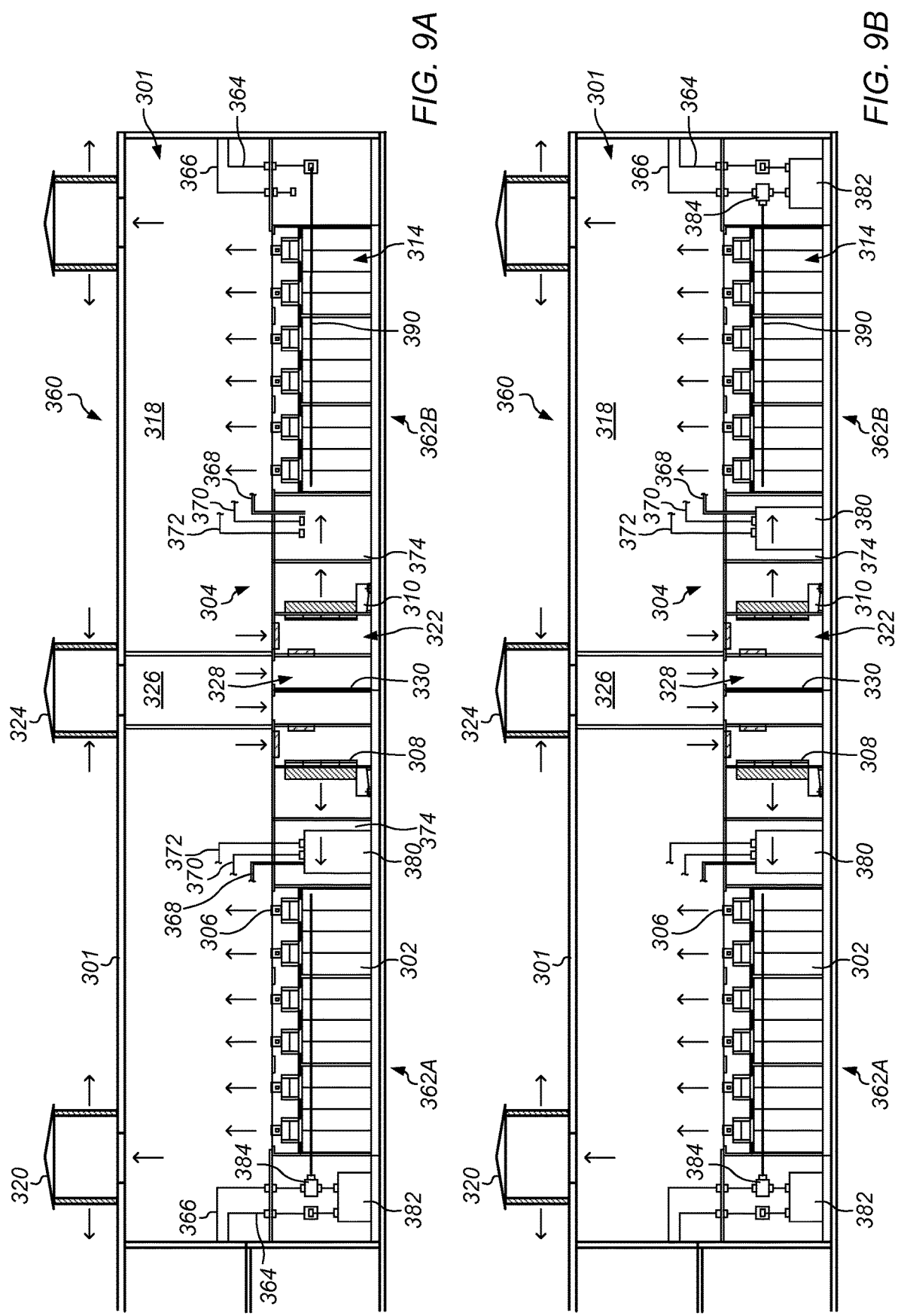

NEGATIVE PRESSURE AIR HANDLING SYSTEM

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a racking system. Some known racking systems include 40 such rack-mounted components and such racking systems will therefore generate as much as 10 kilowatts of waste heat. Moreover, some known data centers include a plurality of such racking systems. Some known data centers include methods and apparatus that facilitate waste heat removal from a plurality of racking systems, typically by circulating air through one or more of the rack systems.

Many data center includes numerous rack-mounted servers housed in a building, which provides protection operating equipment. Such buildings may require a substantial investment in the form of construction costs, maintenance costs, and/or leasing costs. In addition, substantial time and resources are typically required to design and build a data center (or expansion thereof), lay cables, install racks and cooling systems. Additional time and resources are typically needed to conduct inspections and obtain certifications and approvals, such as for electrical and HVAC systems.

Many data centers rely on forced air systems and air conditioning to maintain the temperatures and other environmental conditions in the data center within acceptable limits. The initial and ongoing costs of installing and operating these systems may add substantial cost and complexity to data center operations.

Many data centers include back-up components and systems to provide back-up power to servers in the event of a failure of components or systems in a primary power system. In some data centers, each primary power system may have its own back-up system that is fully redundant at all levels of the power system. For example, in a data center having multiple server rooms, each server room may have its own primary power system and back-up power system. The back-up system for each server room may have a switchboard, uninterruptible power supply (UPS), and floor power distribution unit (PDU) that mirrors a corresponding switchboard, uninterruptible power supply, and floor power distribution unit in the primary power system for that server room. Providing full redundancy of the primary power systems may, however, be very cost both in terms of capital costs (in that in may require a large number of expensive switchboard, UPSs, and PDUs, for example) and in terms of costs of operation and maintenance. In addition, with respect to the primary computer systems, special procedures may be required to switch components from the primary system to a back-up system, further increasing maintenance costs.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to effect.

BRIEF DESCRIPTION OF THE DRAWINGS

FIG. 5A is a front elevation view illustrating one embodiment of a data center with air moving devices that pull air from air intake vents on the roof a building and discharge heated air through the roof of the data center. FIG. 5B is a cross section view of a data center with air moving devices that pull air from air intake vents on the roof a building and discharge heated air through the roof of the data center.

FIGS. 9A and 9B illustrate one embodiment of a data center with rows pre-configured for conversion from one operating environment to another operating environment.

Figure 1:
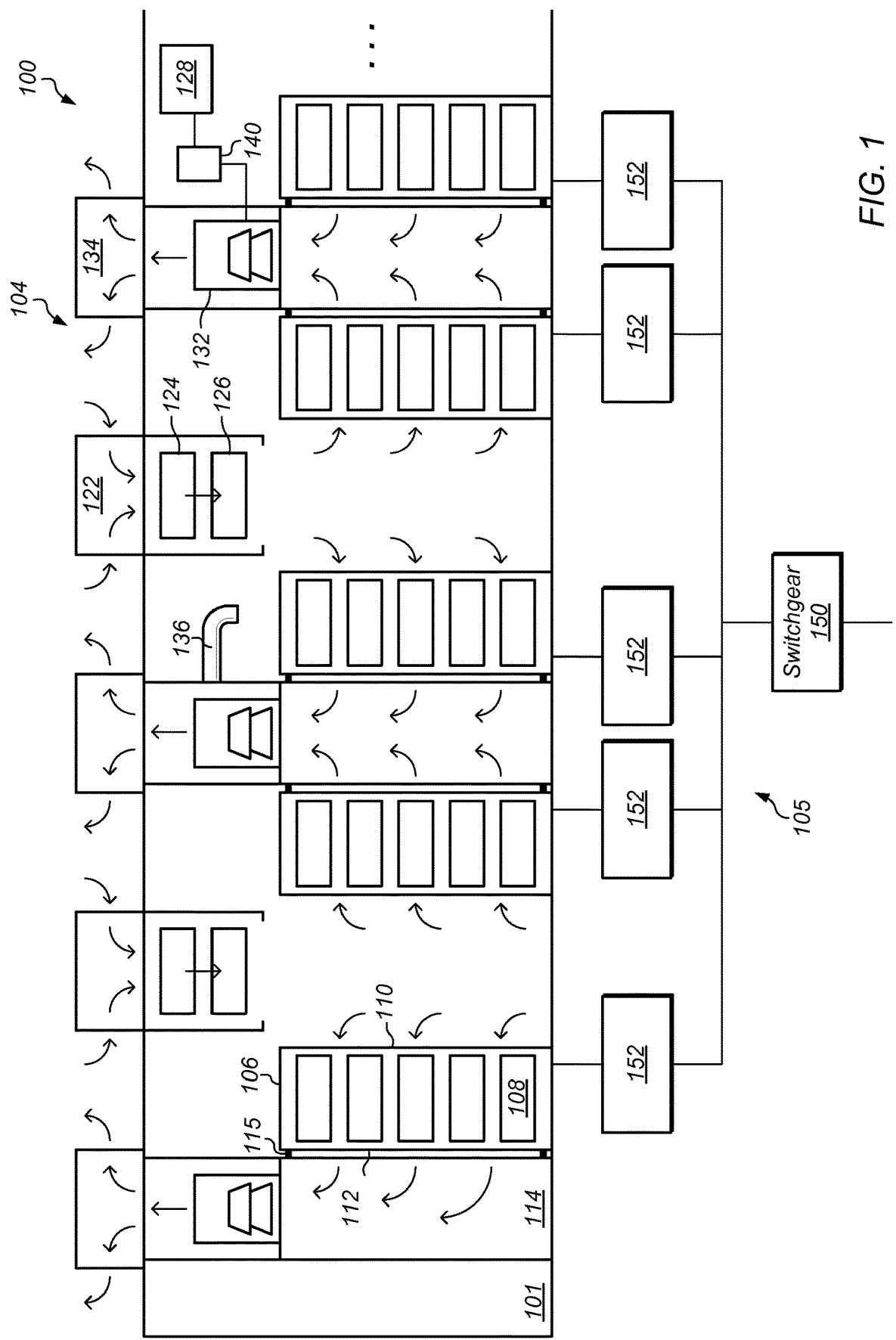
FIG. 1 illustrates one embodiment of a data center having external fans that pull air through rack computing systems.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Systems and methods for providing computing resources are disclosed. According to one embodiment, a data center includes two or more rack computing systems and an air handling system. The rack computing systems may each include racks and computing devices mounted in the rack. The air handling system includes one or more air moving devices external to the one or more racks. The air moving devices create a negative pressure relative to ambient air at air inlets to the racks to draw air from the inlets and through computing devices in the racks.

According to one embodiment, a data center includes two or more rack computing systems and a free cooling system, and an electrical power system. The free air cooling system includes air moving devices external to the rack computing systems. The air moving devices creates a negative pressure to draw air through computing devices in the rack computing systems. The electrical power system includes switchgear and one or more power panels. The switchgear receives power from a utility power feed. The power panels receive power from the switchgear. Computing devices of the rack computing systems are coupled to at least one of the power panels. The power panels supply electrical power to the computing devices.

According to one embodiment, a data center includes two or more rack computing systems and a free cooling system, and an electrical power system. The free air cooling system includes air moving devices external to the rack computing systems. The air moving devices creates a negative pressure to draw air through computing devices in the rack computing systems. The electrical power system provides electrical power to the computing devices. At least some of the computing devices are configured to receive power from the utility power feed without a back-up power source.

According to one embodiment, a method of operating a data center, includes providing a first operating environment in a first portion of the data center and providing a second operating environment in a second portion of the data center. The first operating environment meets a first set of infrastructure specifications. The second operating environment meets a second set of infrastructure specifications. At least some of the infrastructure specifications of the second set of infrastructure specifications are less stringent than corresponding infrastructure specifications of the first set of one or more infrastructure specification. The first set of computing systems is operated in the first operating environment. The second set of computing systems is operated in the second operating environment. Each of the sets of computing systems is used to provide different computing services.

As used herein, "infrastructure" means systems, components, or elements of a system that provide resources for a computing device, such as electrical power, data exchange capability with external systems, air, heat removal, and environmental control (for example, humidity control, particulate control).

As used herein, "infrastructure specification" means a specification of a characteristic or condition of infrastructure or its system or its components. Examples of infrastructure specifications include a power load specification, a reliability specification for electrical power (for example, mean time between failure), a redundancy level of an electrical power system (such as N+1), an operating temperature range for air, a rate of air flow, a humidity level, or a reliability specification for a cooling resource.

As used herein, an "operating environment", in the context of computing resources, means the space, facilities and infrastructure resources provided for the computing resources. An operating environment for a set of rack computing systems includes the space, power, data interchange, cooling, and environmental control resources provided for the set of computing systems.

As used herein, "reliability" is a measure of the ability of a system or components to perform or maintain functions.

As used herein, "reliability specification" means a specification of a characteristic or condition of system or its components that affects the reliability of the system.

As used herein, "adiabatic system" means a system that cools by evaporation of a liquid.

As used herein, an "aisle" means a space next to one or more racks.

As used herein, "air handling system" means a system that provides or moves air to, or removes air from, one or more systems or components.

As used herein, "air moving device" includes any device, element, system, or combination thereof that can move air. Examples of air moving devices include fans, blowers, and compressed air systems.

As used herein, "ambient" refers to a condition of outside air at the location of a system or data center. An ambient temperature may be taken, for example, at or near an intake hood of an air handling system.

As used herein, a "cable" includes any cable, conduit, or line that carries one or more conductors and that is flexible over at least a portion of its length. A cable may include a connector portion, such as a plug, at one or more of its ends.

As used herein, a "cold aisle" means an aisle from which air can be drawn for use in removing heat from a system, such as a rack computing system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "direct evaporative cooling" means cooling of air by evaporation of liquid directly into a stream of air to be cooled.

As used herein, "evaporative cooling" means cooling of air by evaporation of liquid.

As used herein, "floor power distribution unit" refers to a power distribution unit that can distribute electrical power to various components in a computer room. A power distribution unit may be housed in an enclosure, such as a cabinet.

As used herein, a "free cooling" includes a mode of operation in which an air handling sub-system pulls air at least partially from an external source (such as air outside a facility) and forces the air to electronic equipment without active chilling in the air-handling sub-system (e.g., fluid flow through the chiller coils in the air handling sub-system is shut off by closing a flow control valve).

As used herein, a "hot aisle" means an aisle into which heated air can be discharged for use in removing heat from a system, such as a rack computing system.

As used herein, "mechanical cooling" means cooling of air by a process that involves doing mechanical work on at least one fluid, such as occurs in vapor-compression refrigeration systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "power distribution unit" refers to any device, module, component, or a combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.)

As used herein, "power panel" means any panel, device, module, component, or combination thereof, that can be used to transfer or distribute electrical power from one or more input conductors to one or more output conductors. In certain embodiments, a remote power panel includes main lug only panel conductors. A remote power panel may be housed in an enclosure, such as a cabinet.

As used herein, "primary power" means any power that can be supplied to an electrical load, for example, during normal operating conditions.

As used herein, "rack computing systems" means a computing system that includes one or more computing devices mounted in a rack.

As used herein, "reserve power" means power that can be supplied to an electrical load upon the failure of, or as a substitute for, primary power to the load.

As used herein, "room" means a room or a space of a building. As used herein, "computer room" means a room of a building in which computing devices, such as rack-mounted servers, are operated.

As used herein, a "space" means a space, area or volume.

In some embodiments, a data center includes an air handling system with fans external to rack computing systems that create a negative pressure to draw air through computing devices in the racks. The fans may be mounted, for example, in a row above a hot aisle that is adjacent to the racks. In certain embodiments, the data center provides direct evaporative cooling upstream from the racks.

FIG. 1 illustrates one embodiment of a data center having external fans that pull air through rack computing systems. Data center 100 includes room 101, rack computing systems 102, air handling system 104, and electrical power system 105. Each of rack computing systems 102 includes rack 106 and computing devices 108. Computing devices 108 may be mounted in racks 106. Racks 106 may include vents on front sides 110 of racks 106 and back sides 112 of racks 106. Vents in the racks may allow air flow through in either direction through the interior of racks 106, and through computing devices 108 held in racks 106.

Each of rack computing systems 102 may be positioned next to one of chambers 114. Each of chambers 114 may partially contain air exiting from racks 104 and segregate the air exiting the racks from other air in room 101. Chambers 114 may serve as a hot aisle for one of rack computing systems 102. Spaces in front of racks 106 may serve as cold aisles for rack computing systems 102.

In some embodiments, racks 106 are movable. Racks 104 may be moved into a connection with the walls of chamber 114. For example, racks 106 may be rolled on wheels against a wall of chamber 114. Seal elements 115 may be provided to seal air at the connection between racks 106 and chamber 114. In one embodiment, seal elements may go around the perimeter of an opening in a wall of chamber 114. For example, each of seal elements 115 may be in the form of a gasket. Seal elements 115 may be made of any suitable material. Examples of materials include a resilient polymeric material, expanded foam, or a fabric.

In the embodiment shown in FIG. 1, racks 106 may be moved into contact with the wall of a hot aisle chamber. In certain embodiments, the hot aisle/cold aisle arrangement may be reversed such that the cold aisle is enclosed by walls, and the racks are moved into contact with a wall of a chamber for the cold aisle.

Air handling system 104 includes air removal systems 120, intake vents 122, filters 124, evaporative cooler 126, and control system 128. Each of air removal systems 120 includes air moving devices 130, duct 132, and exhaust roof vent 134. Although in FIG. 1 only one symbol is shown to represent air moving devices 130 for each air removal system, each of air removal systems 120 may include any number of air moving devices. In some embodiments, air moving devices are arranged in a row above a hot aisle, such as the hot aisle provided in chamber 114 of data center 100.

Air moving devices 130 may be operated to create negative pressure in chambers 114 relative to the air at the inlet openings in racks 106. In the system shown in FIG. 1, the air pressure at the inlets may match the ambient air pressure in room 101. The negative pressure in chambers 114 may draw air through racks 106 and through computing devices 108 installed in racks 106. Air moving devices 130 may pull heated air from the hot aisles and force the heated air through ducts 132.

Some or all of air removal systems 120 may include recirculation plenum 136. Recirculation plenum 136 may receive some of the air discharged into ducts 132. Recirculation plenum 136 may vent some air into room 101. Recirculated air from recirculation plenum 136 may mix with outside air introduced through intake vents 122. In some embodiments, air recirculated from an air removal system (such as air removal systems 120) is combined with outside air in a mixing plenum.

Air coming into room 101 through intake vents 122 may pass through filters 124 and evaporative cooler 126. In one embodiment, a system provides direct evaporative cooling of air. Evaporative cooler 126 may include a wetted media. The wetted media may be used for evaporative cooling of air to be provided to computing devices in rack computing systems 102. In some embodiments, an evaporative cooler includes a bypass mode. The bypass mode may allow air coming into the data center to be sent directly to rack computing systems in the room, without evaporative cooling.

Filters 124 may be of any suitable type. In some embodiments, each of filters 124 includes a series of filters. For example, air may be forced successively through a pre-filter, a final filter, and a carbon filter. In one embodiment, the pre-filter is a two-inch pleated 30% filter manufactured by Airguard. In one embodiment, a final filter is a 12-inch 95% filter manufactured by Airguard. In one embodiment, a carbon filter is a 12-inch high mass bonded carbon filter manufactured by Sparks.

Control system 128 may be coupled to air moving devices 130 (in FIG. 1, control system 128 is shown connected to only one of air moving devices 130 for clarity) by way of variable frequency drives (VFDs) 140. Each of VFDs 140 may receive control signals from control system 128 and subsequently modulate a rotational velocity of a fan in one of air moving devices 130. In certain embodiments, an outside air damper, return air damper, exhaust damper, or combinations thereof, are modulated via a control system to modulate air flow. In one embodiment, air is drawn from a mixing plenum and through an evaporative cooler. The evaporative cooler may evaporate a liquid into air as it passes through the evaporative cooler.

In certain embodiments, a control unit includes at least one programmable logic controller. The PLC may, among other things, regulate air moving devices and open and close valves or dampers in cooling air systems based upon command signals from an operator to channel air flow through a data center as necessary for the prevailing operational conditions. Alternatively, the PLC may modulate valves and dampers between fully open and fully closed positions to modulate airflow.

A control system may include temperature measurement devices that are, in one embodiment, thermocouples. Alternatively, the temperature measurement devices include, but are not limited to, resistance temperature detectors (RTDs) and any device that facilitate cooling operation as described herein. For example, a thermocouple may be positioned within mixing plenum to facilitate measuring a temperature of the air in the mixing plenum.

In various embodiments, operation of one or more air handling systems may be controlled in response to one or more conditions. For example, control system 128 may be programmed to increase the speed of some or all of air moving devices when one or more predetermined conditions are met, such as temperature and humidity.

Electrical power system 105 includes switchgear 150 and power panels 152. Switchgear 150 may receive power from a utility feed. Power panels 152 may be electrically coupled to switchgear 150. In some embodiments, one or more transformers are provided upstream from switchgear 150, between switchgear 150 and power panels 152, or both. Transformers in electrical power system 105 may transform power from utility power to suitable voltage levels for power supply units in computing devices 106.

In certain embodiments, back-up power systems, such as a UPS, or a reserve power system may be included in electrical power system 105 for some or all of rack computing systems 102. In one embodiment, an electrical power system 105 includes automatic transfer switches. The automatic transfer switches may switch to a reserve power system in response to detecting a failure in a primary power system supplying power to rack computing systems 102.

Electrical power system 105 may include various cables that supply electrical power to computing devices 108. Cabling provisions in electrical power systems may vary from data center to data center. For example, cabling may include connector plugs, or a power whip with individual wires that must be separately attached to terminals on a power panel. In certain embodiments, power panels (such as power panels 152) may be omitted. For example, cables may be strung from switchgear 150 to computing devices 106.

Figure 2:
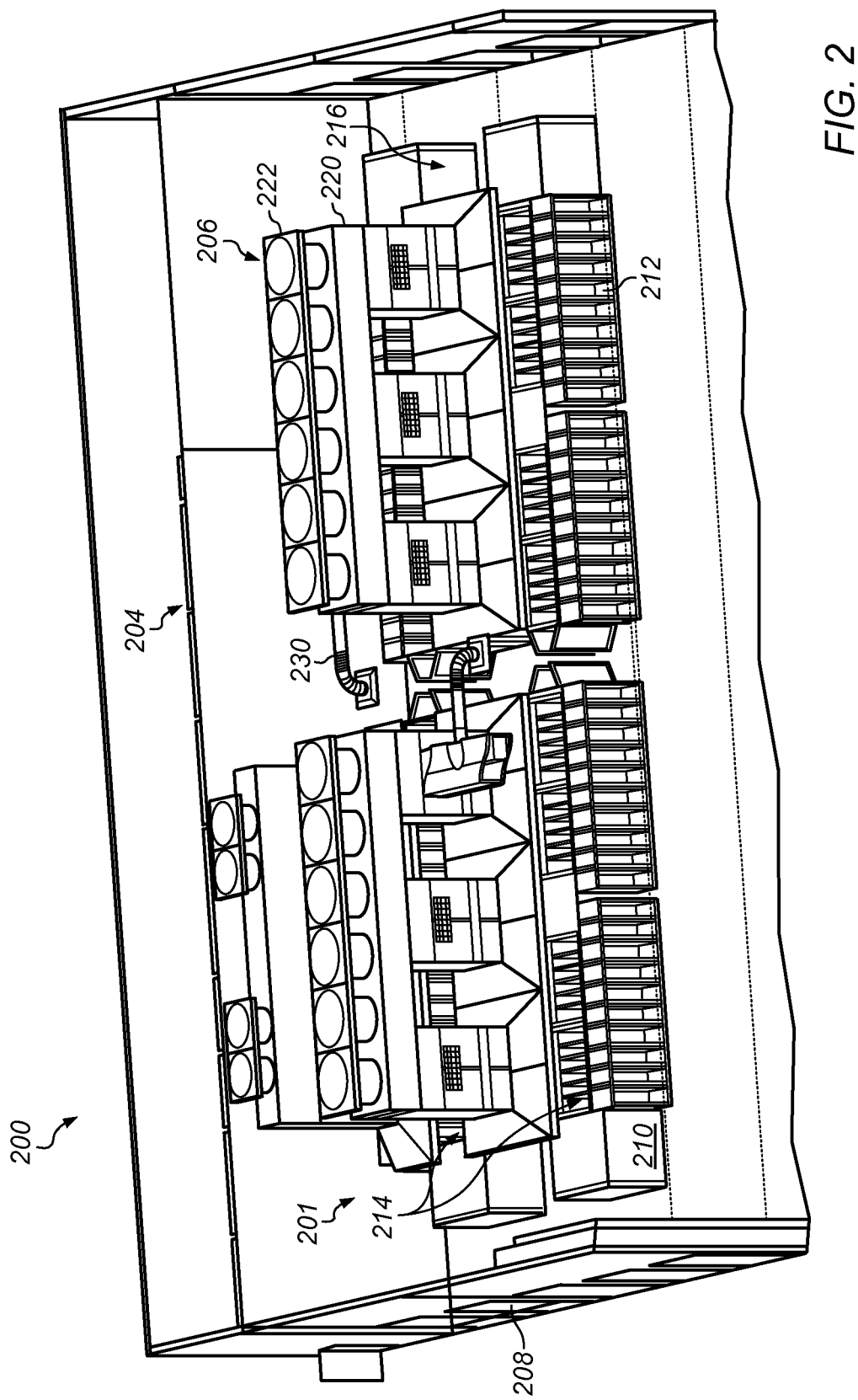
FIG. 2 illustrates one embodiment of a data center having multiple air removal systems in a common room.

In some embodiments, multiple air removal systems are provided in a common computing room of a data center. Each of the air removal systems may include air moving devices that create negative pressure in a hot aisle that produces air flow in rack-mounted computing devices. One or more walls of the computing room may include intake vents for supplying outside air for cooling the data rack computing systems in the data center. Alternating hot aisles and cold aisles may be provided between successive rows of racks. FIG. 2 illustrates one embodiment of a data center having multiple air removal systems in a common room. Data center 200 includes room 201, rack rows 203, and cooling system 204. Cooling system 204 includes air removal systems 206, air intake vents 208, and direct evaporative cooling system 210.

Rack rows 202 include racks 212. Rack rows 202 may be spaced across the floor of room 202. Computing devices may be mounted in racks 212 (in FIG. 2, computing devices have been omitted for clarity). The front of each of racks 212 may adjoin one of cold aisles 214. The back of each of racks 212 may adjoin on of hot aisles 216. One of air removal systems 206 may be provided over each of hot aisles 216.

Air removal systems 206 include ducts 220 and air moving devices 222. Air moving devices 222 may be coupled to one or more control systems. Air moving devices 222 may create air flow by drawing air out of hot aisles 216. Air from hot aisles 216 may be expelled from the data center (for example, through the roof of the data center), recirculated, or a combination thereof. Outside air may be drawn through vents 208 into room 201. Air in room 201 may be drawn through direct evaporative cooling systems 210 and into cold aisles 214. In some embodiments, evaporative cooling elements in direct evaporative cooling systems 210 can be selectively bypassed.

Although only two rows of heat removal systems are shown in FIG. 2 for illustrative purposes, a data center may in various embodiments include any number of rows of racks and any number of heat removal systems. Rack rows may be arranged in pair such that the front of the rack in each row faces the front of an adjacent rack row, and the back of the rack faces the back of an adjacent row of racks. In one embodiment, an air removal system with a row of air moving devices is provided over each hot aisle.

Air removal systems 206 include recirculation ducts 230. Recirculation ducts 230 may return a portion of the air drawn from hot aisle 216 and return it for recirculation through computing devices in racks 212. In the system shown in FIG. 2, recirculated air is discharged into space at commonly adjoining ends of two rack rows.

Figure 3:
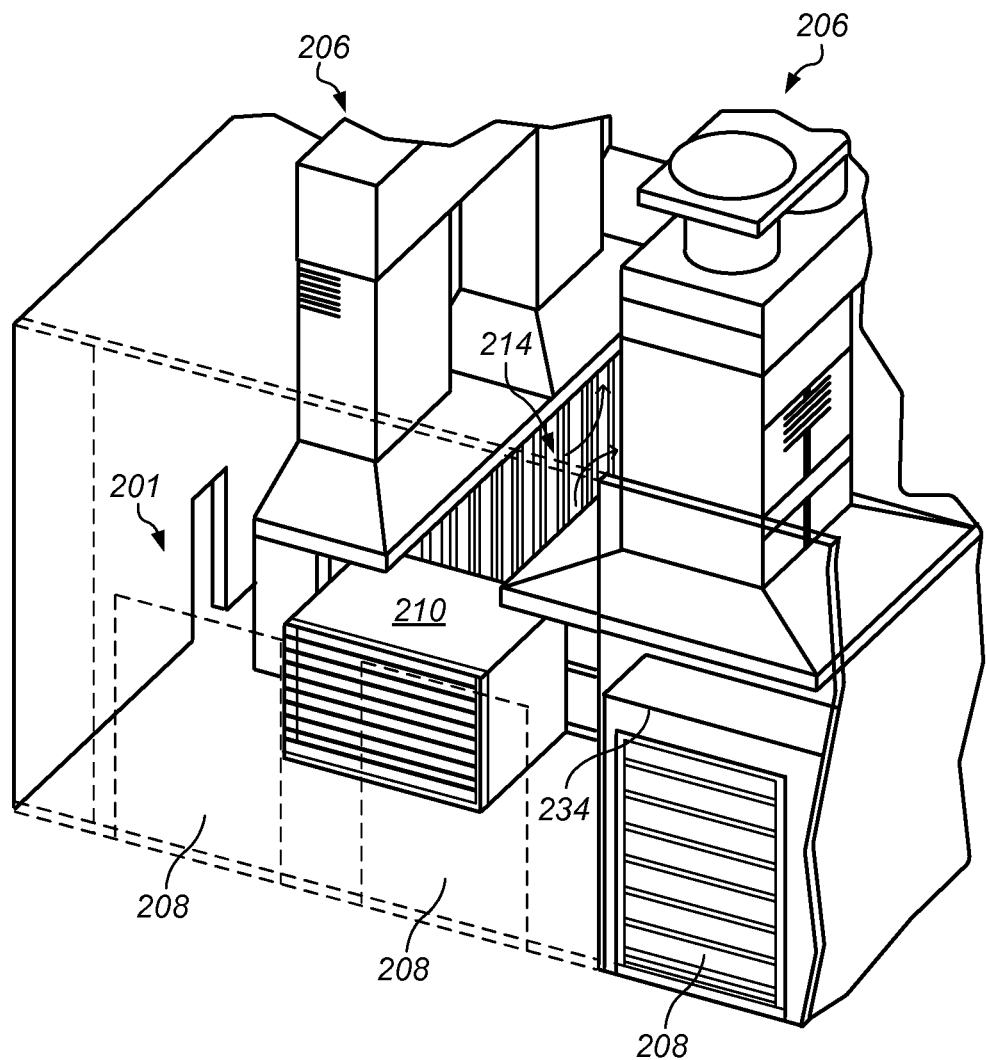
FIG. 3 illustrates one embodiment of the air intake portion of a data center.

FIG. 3 illustrates one embodiment of the air intake portion of a data center. Data center 200 includes vents 208 in the exterior walls of room 201. Each of vents 208 may be provided with filters 234. Filters 234 may remove contaminants from air before the air is used to cool computing devices in data center 200. Air may be drawn through evaporative cooler 210 and into cold aisle 214.

Figure 4:
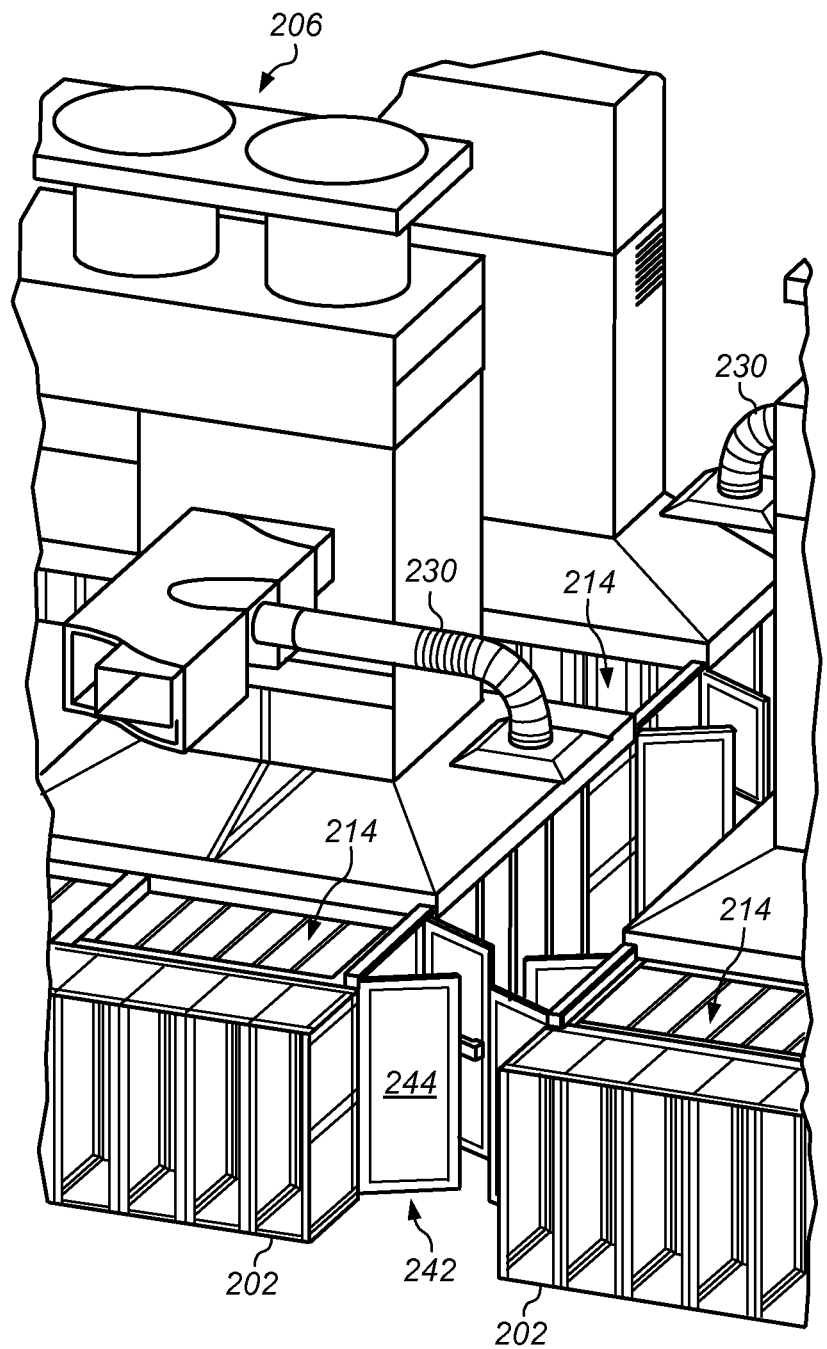
FIG. 4 illustrates one embodiment of a mixing region of a data center.

FIG. 4 illustrates one embodiment of a mixing region of a data center. Data center 200 includes mixing region 240. Recirculation ducts 230 may recirculate air that has been pulled into air removal system 206 back into room 201. Air from recirculation ducts 230 may mix with air in common aisle 242 between banks of rack rows 202. Doors 244 may be used to control air flow between common aisle 242 and various cold aisles 214.

In some embodiments, a data center includes an air removal system that creates a negative pressure in a hot aisle to pull air in through the roof of the data center and through computing devices in the data center. FIG. 5A is a front elevation view illustrating one embodiment of a data center with air moving devices that pull air from air intake vents on the roof a building and discharge heated air through the roof of the data center. FIG. 5B is a cross section view of the data center shown in FIG. 5A taken along line 5B-5B. Data center 300 includes room 301, rack computing systems 302, and cooling system 304. Each of rack computing systems 302 may include computing devices (the computing devices are not shown in FIG. 5A for clarity). Cooling system 304 includes exhaust fans 306, filter bank 308, and evaporative cooler 310. Exhaust fans 306 are mounted above hot aisles 312 adjacent to rack rows 314.

Exhaust fans 306 draw air from cold aisles 316, through computing devices in rack computing systems 302, and into hot aisles 312. Exhaust fans 306 may expel air from hot aisle 312 into exhaust plenum 318. Air in exhaust plenum 318 may be expelled through vents in air exhaust penthouse 320.

Supply air for cooling may be drawn from mixing plenums 322. Air from the mixing plenum may pass through filter banks 308 and evaporative cooler 310.

Air in mixing plenum 322 may be outside air, recirculated air, or a combination of both. Outside air may be received through outside air intake penthouse 324. Air received through outside air intake penthouse 324 may be channeled to outside air plenums 328 by way of outside air chase 326. Divider 330 may separate flow from outside air chase 326 into outside air plenums 328.

Dampers may be provided between mixing plenum 322 and exhaust plenum 318 and between mixing plenum 322 and outside air plenums 328. The dampers may be operated to control the mix of air in mixing plenums 322.

In some embodiments, an exhaust fan 306 is provided for, and corresponds to, each of rack computing systems 302. Exhaust fans 306 may be connected to a control system (the control system is not shown in FIG. 5A for clarity). In one embodiment, exhaust fans 306 are direct drive fans. Each of exhaust fans 306 may be separately controlled. In certain embodiments, two or more of exhaust fans 306 are commonly controlled.

Data center 300 includes intake fan 340. Intake fan 340 may draw air in from outside of data center 300 and move the air through rack systems in the data center. Intake fan 340 may cooperate with air moving devices downstream from rack systems, such as exhaust fans 306. In some embodiments, intake fan 340 is omitted. In certain embodiments, all of the air moving devices in a data center may be upstream from the rack systems, such as intake fan 340.

Figure 6A:
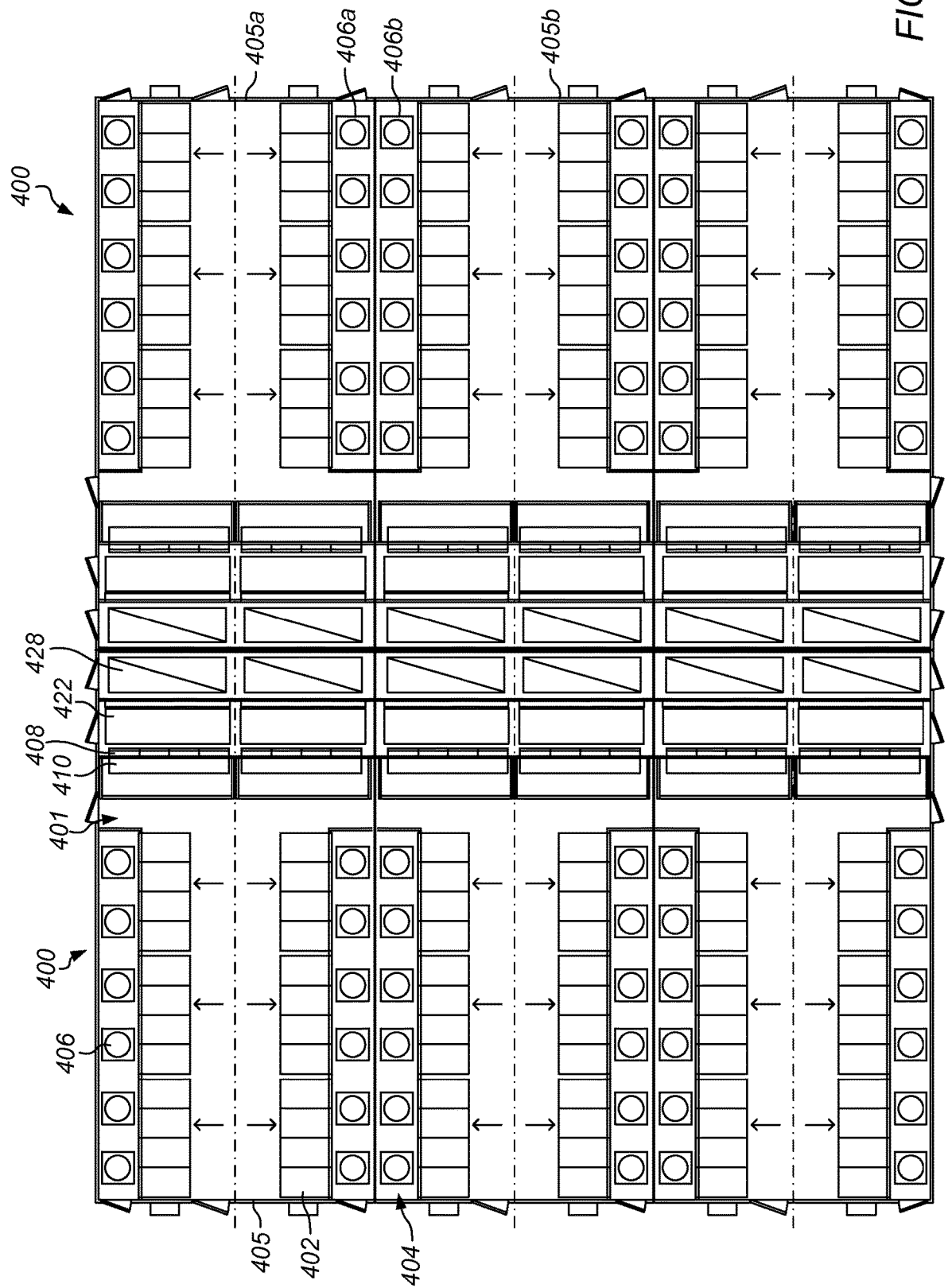
FIG. 6A is a plan view illustrating a data center with air removal systems for pod-based computing systems.
Figure 6B:
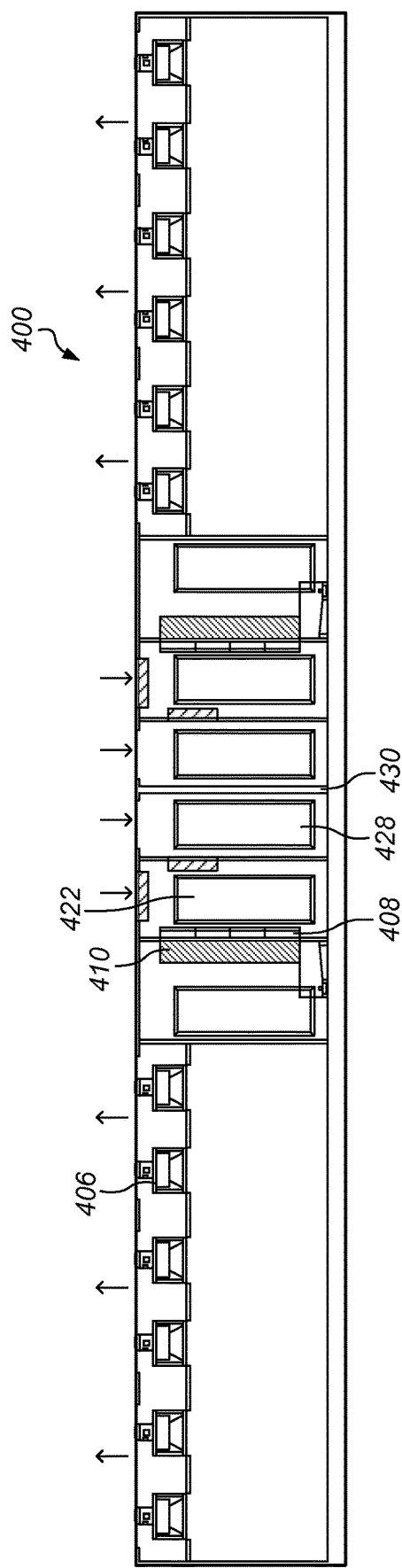
FIG. 6B is a front elevation view illustrating a data center with air removal systems for pod-based computing systems.
Figure 6C:
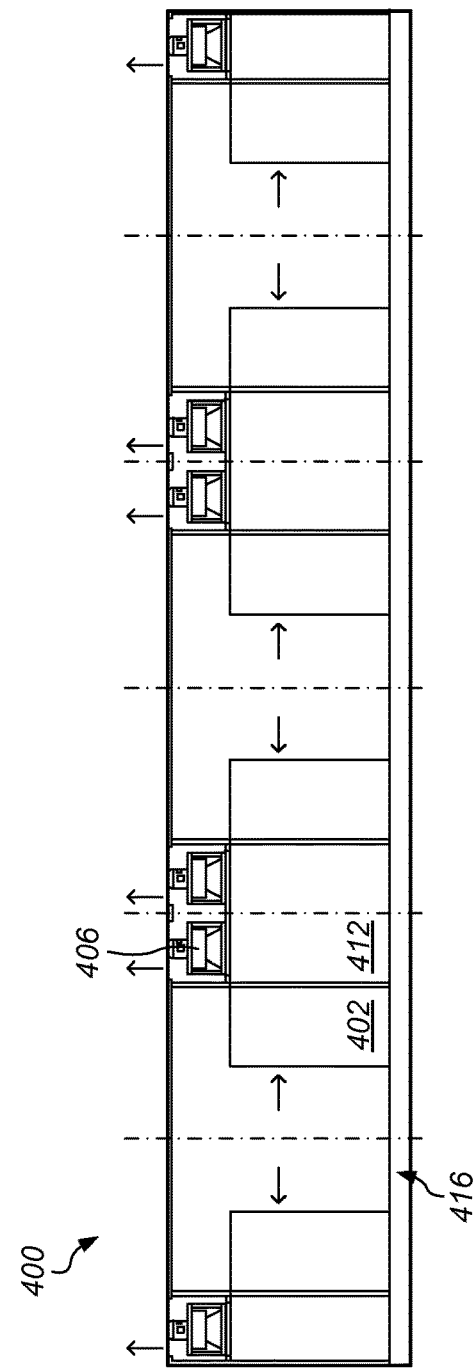
FIG. 6C is a side elevation view illustrating a data center with air removal systems for pod-based computing systems.

In some embodiments, a data center includes an air removal system that creates a negative pressure in a hot aisle to pull air through computing devices in the data center. In some embodiments, a data center includes pods of rack computing systems arranged in one or more rows and columns. FIG. 6A is a plan view illustrating one embodiment of a data center with computing pods, and air moving devices that pull air from air intake vents on the roof a building and discharge heated air through the roof of the data center. FIG. 6B is a front elevation view of the data center illustrated in FIG. 6A. FIG. 6C is a side elevation view of the data center illustrated in FIG. 6A. Data center 400 includes room 401, rack computing systems 402, and cooling system 404. Rack computing systems are provided in pods 405. Each of rack computing systems 402 may include computing devices (the computing devices are not shown in FIGS. 6A, 6B, and 6C for clarity). Cooling system 404 includes exhaust fans 406, filter bank 408, and evaporative cooler 410. Exhaust fans 406 are mounted above hot aisles 412 adjacent to rack rows 414.

Exhaust fans 406 draw air from cold aisles 416, through computing devices in rack computing systems 402, and into hot aisles 412. Exhaust fans 406 may expel air from hot aisle 412 into an exhaust plenum.

In some embodiments, elements of an air removal system may be shared among two or more pods in a data center. For example, in the data center shown in FIG. 6A, exhaust fans 406a for computing devices in pod 405a and exhaust fans 406b for computing devices in pod 405b may feed into a common exhaust plenum above exhaust fans 406a and exhaust fans 406b.

Supply air for cooling may be drawn from mixing plenums 422. Air from the mixing plenum may pass through filter banks 408 and evaporative cooler 410.

Air in mixing plenum 422 may be outside air, recirculated air, or a combination of both. Outside air may be received through outside an air intake penthouse. Air received through the outside air intake penthouse may be channeled to outside air plenums 428 by way of outside air chase 426. Divider 430 may separate flow from outside air chase 426 into outside air plenums 428.

Dampers may be provided between mixing plenum 422 and exhaust plenum 418 and between mixing plenum 422 and outside air plenums 428. The dampers may be operated to control the mix of air in mixing plenums 422.

In some embodiments, an exhaust fan 406 is provided for, and corresponds to, each of rack computing systems 402. Exhaust fans 406 may be connected to a control system (the control system is not shown in FIG. 6A, 6B, or 6C for clarity). In one embodiment, exhaust fans 406 are direct drive fans. Each of exhaust fans 406 may be separately controlled. In certain embodiments, two or more of exhaust fans 406 are commonly controlled.

In some embodiments, a data center includes a base cooling system and a base power system. For example, the data center may include free cooling via bulk air moving devices with no mechanical cooling, and a streamlined power supply chain. In one embodiment, the power system may include switchgear to power panels, but no generator, and no reserve power system or automatic transfer switches. In certain embodiments, the power system does not include UPSs.

In some embodiments, a data center includes multiple levels of operating environments. For example, a full operating environment may be provided for some rack computing systems in the data center and an operating environment with a more streamlined infrastructure may be provided for other rack computing systems in the data center. Infrastructure specifications (for example, power redundancy, mean-time-between-failure, maximum temperature) for the base environment are less stringent than for corresponding infrastructure specifications for the full environment.

In some embodiments, different types of computing operations may be carried out in different operating environments. For example, computing operations requiring a high level of service, reliability, or redundancy may be carried out in a full computing environment, while computing operations requiring a lower level of service, reliability, or redundancy may be carried out in a computing environment with a more streamlined infrastructure. Each operating environment may be supported by a different level of infrastructure. In some embodiments, different services are provided using different operating environments in a data center. For example, cloud computing services may be provided from a full environment in the data center (for example, with mechanical cooling, reserve power, and UPSs), while storage services may be provided from a base environment in the data center.

Figure 7:
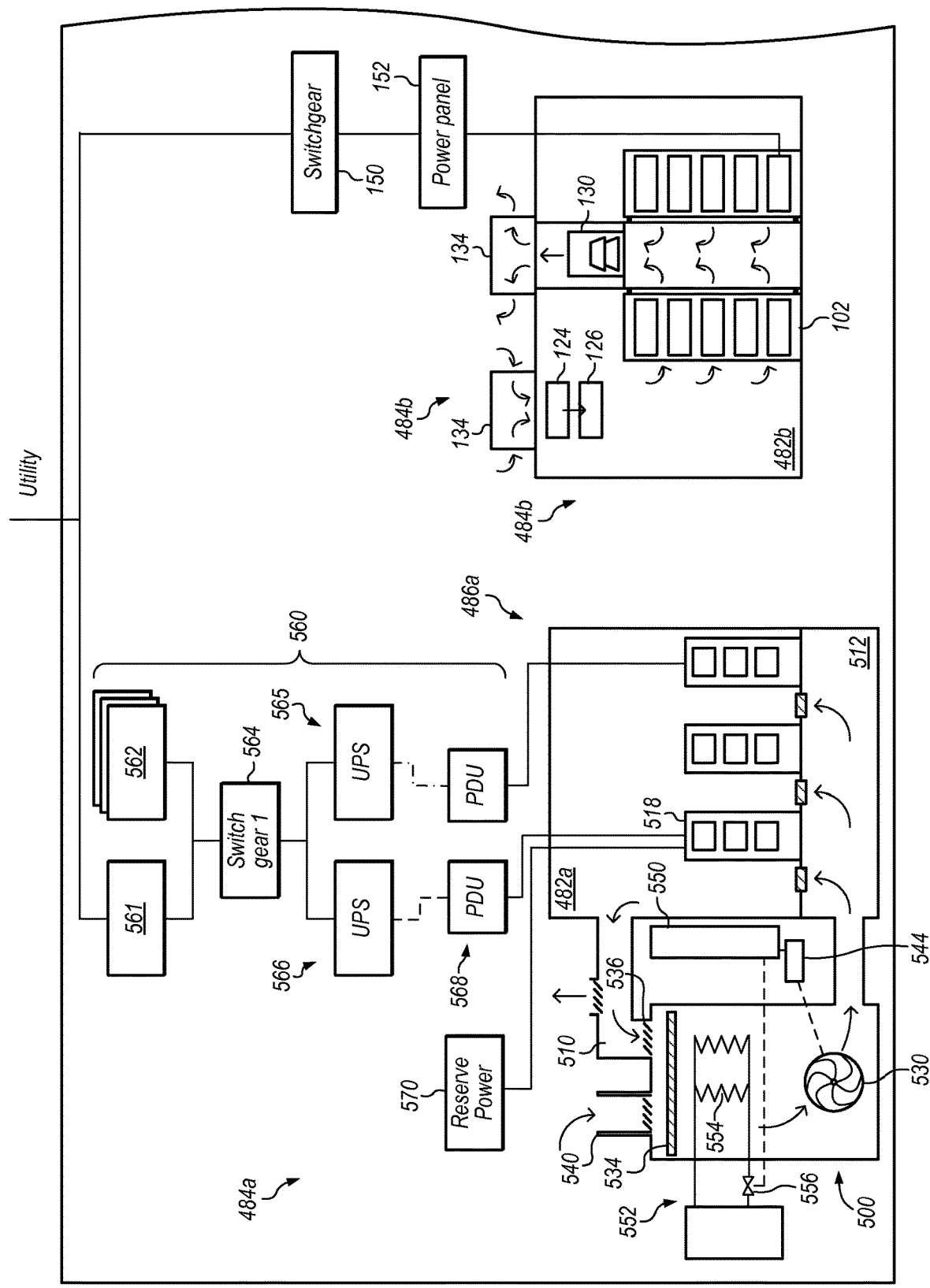
FIG. 7 is a block diagram illustrating one embodiment of a data center that includes multiple levels of operating environments.

FIG. 7 is a block diagram illustrating one embodiment of a data center that includes multiple levels of operating environments. Data center 480 includes data center room 482a and data center room 482b. Data center room 482a is supported by infrastructure 484a. Data center room 482b is supported by infrastructure 484b. Data center 482a and infrastructure 484a provide operating environment 486a for rack computing systems 518. Data center room 482b and infrastructure 484b provide operating environment 486b for rack computing systems 102.

Cooling system 500 for data center 482a includes air handling sub-systems 504. Air handling sub-systems 504 may provide cooling air to data center room 482a.

Each air handling sub-system 504 may be coupled to data center room 482a by supply duct 508 and return duct 510. Cooling air may flow from air handling sub-system 504 through supply duct 508 into plenum 512. From plenum 512, cooling air may pass through into data center room 482a. Cooling air may pass over racks 518. After the air is heated by racks 518, the air may pass through return duct 510. Air may be recirculated through one or more air handling sub-systems or discharged from the system through exhaust vent 520.

Air handling sub-system 504 includes fan 530, humidifier 532, filter 534, return air vent 536, return air dampers, outside air vent 540, and outside air dampers. Fan 550 is coupled to VFD 544. VFD 544 is coupled to control unit 550. Return air vent 538 may receive air returning from data center room through return duct 510. Outside air vent 540 may receive outside air.

Cooling system 500 includes chilled water subsystems 552. Chilled water subsystems 552 may be coupled in heat transfer communication with air handling sub-systems 504. Chilled water sub-system 552 includes coils 554 and valve 556. Valve 556 is coupled to control unit 550. Valve 556 may be opened and closed by signals from control unit 550. The position of valve 556 may be used to regulate the use of chilled water to cool air in air handling sub-system 504. In one embodiment, a common chilled water subsystem 552 provides chilled water to two more of air handling sub-systems 504. In certain embodiments, each air handling sub-system 504 is cooled by a dedicated chilled water subsystem 552.

In some embodiments, chilled water subsystems 552 may be coupled to a chilled water heat removal system. Examples of chilled water heat removal systems include a service water subsystem, air-conditions refrigerant sub-system, or a cooling tower sub-system.

Control unit 550 may be programmed to control devices in handling sub-systems 504 and/or chilled water sub-systems 552. Control unit 550 may be coupled to fan 530, humidifier 532, return air dampers, outside air dampers, and exhaust dampers. Control unit 550 may be in data communication with temperature sensors and pressure sensors. Devices in air handling sub-systems 504 and chilled water sub-systems 552 may be controlled automatically, manually, or a combination thereof.

Electrical power system 560 includes transformer 561, generators 562, switchgear apparatus 564, and primary power systems 565. Each of primary power systems 565 includes UPS 566 and one or more floor power distribution units ("PDUs") 138.

Electrical systems in rack computing systems 518 may each receive power from one or more of primary power systems 565. In one embodiment, each of primary power systems 565 corresponds to, and provides power to, the servers in one room in a data center. In one embodiment, each of primary power systems 565 corresponds to, and provides power to, one rack system in a data center.

In some embodiments, one or more of floor power distribution units 568 includes a transformer that transforms the voltage from switchgear apparatus 564.

Transformer 561 is coupled to a utility feed. The utility feed may be a medium voltage feed. In certain embodiments, the utility feed is at a voltage of about 13.5 kilovolts or 12.8 kilovolts at a frequency of about 60 Hz. Generators 562 may provide power to primary power systems 565 in the event of a failure of utility power to transformer 561. In one embodiment, one of generators 562 provides back-up power for each of primary power systems 565.

UPS 566 may provide uninterrupted power to racks 104 in the event of a power failure upstream from UPS 566. In certain embodiments, a UPS receives three-phase power from a transformer. The UPS may supply three-phase power to a floor power distribution unit.

Electrical power system 560 includes a reserve power system 570. Reserve power system 570 may provide reserve power for any or all of the electrical systems supplied by one or more primary power systems. In some embodiments, a reserve power system is powered up at all times during operation of a data center. The reserve power system may be passive until a failure of one or more components of the primary power system for one or more of the electrical systems in the system, at which time the reserve power system may become active.

Data center room 482b and infrastructure 484b provide operating environment 486b. Infrastructure 484b does not include a number of the cooling systems and electrical power systems included in infrastructure 484a. In some embodiments, infrastructure 484b may be similar to that shown above relative to FIG. 1. For example, the electrical power system may be limited to switchgear and power panels feeding rack computing systems (without, for example, UPSs or reserve power systems). In addition, cooling resources in infrastructure 484b may be limited to free-air cooling using exhaust fans that pull air from a hot aisle and direct evaporative cooling (without, for example, any mechanical cooling or chilled water subsystems).

Figure 8:
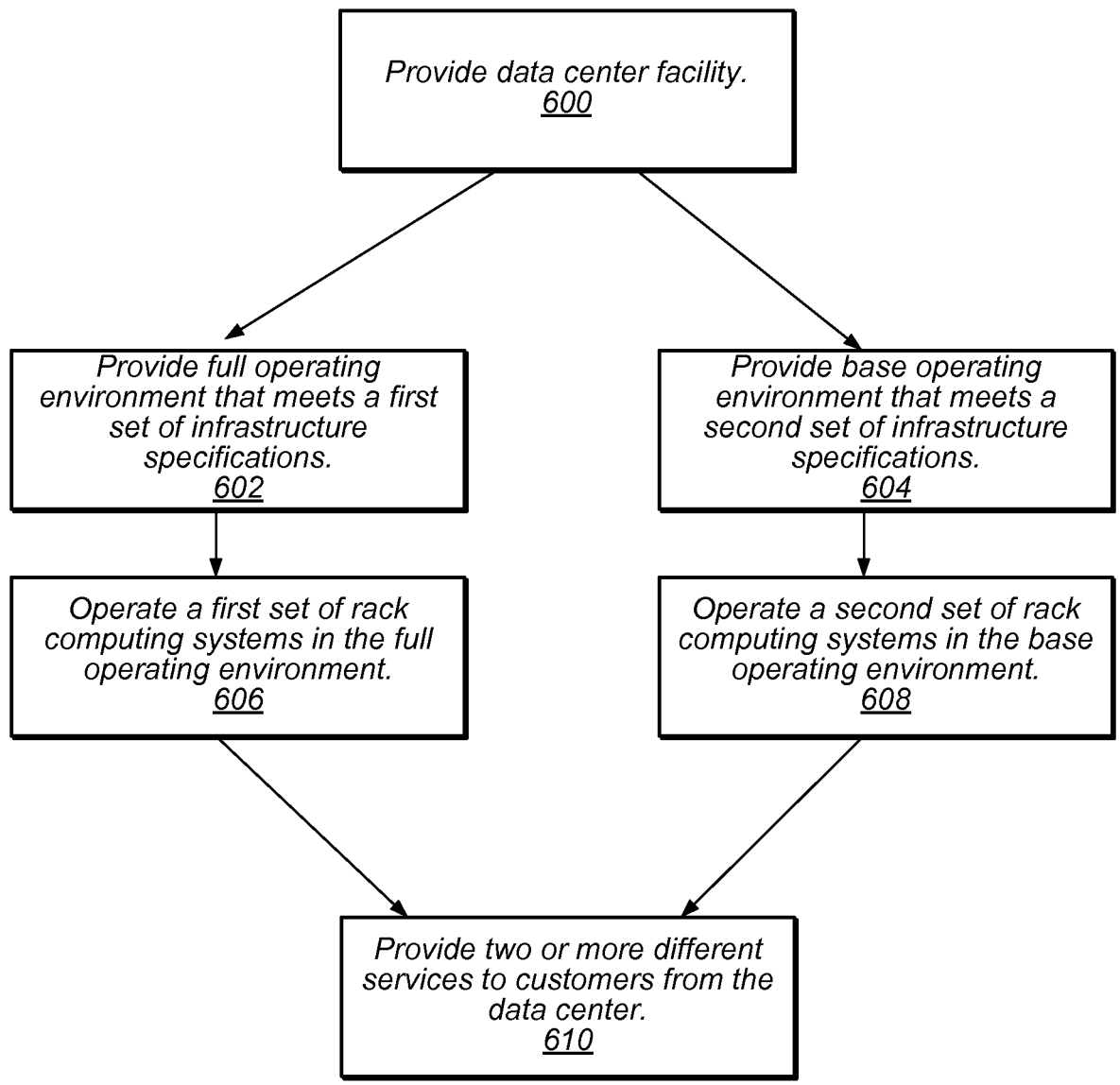
FIG. 8 illustrates operating a data center with multiple levels of operating environments.

FIG. 8 illustrates operating a data center with multiple levels of operating environments. At 600, a data center facility is provided. The data center may include one or more building, rooms, pods, or chambers. The data center may receive a utility feed. At 602, a full operating environment is provided in a first portion of the data center. The full operating environment meets a set of one or more infrastructure specifications. The cooling infrastructure for the full environment may include a mechanical cooling system. The electrical power infrastructure for the full environment may include back-up generator power, automatic switching to a reserve power system, and UPSs.

At 604, a base operating environment is provided in a second portion of the data center. The base operating environment is configured to meet a set of one or more infrastructure specifications. The set of infrastructure specifications for the base environment may be less stringent than those for the full operating environment. For example, the base environment may allow a maximum temperature for cooling air that is higher than the maximum operating temperature of the full environment. As another example, the base environment may be operated without a back-up generator or a reserve power system. In one embodiment, a base operating environment operates without UPSs. In some embodiments, reliability specification varies from one operating environment to another in a data center.

Examples of reliability specifications that may differ from environment to environment in a data center include: mean-time-between-failures and down-time.

Examples of cooling specifications that may differ from environment to environment in a data center include: operating temperature range, minimum operating temperature, maximum operating temperature, humidity range, and minimum flow rate. Examples of electrical power specifications that may differ from environment to environment in a data center include: back-up power, surge suppression, reserve power capability, and voltage levels. In one embodiment, one operating environment in a data center maintains rack air inlet temperatures within a plus or minus about 2 degree range, while a second operating environment in the data center maintains rack air inlet temperatures within a plus or minus about 10 degree range.

At 606, operating a first set of one or more rack computing systems in the first operating environment. The system may be operated to provide computing services one or more customers. At 608, operating a second set of one or more rack computing systems in the second operating environment.

The systems may be operated to perform computing services for one or more customers. The computing services may be different from the computing services. In some embodiments, computing services may be cloud services provided over a computer network. At 610, two or more services are provided to customer by operating computing systems in a full operating environment and a more base operating environment. In some embodiments, a full operating environment may be used to provide services that require a relatively higher level of reliability, and a reduced-infrastructure operating environment may be used to provide services that require a relatively lower level of reliability.

In some embodiments, the infrastructure for reduced-capability operating environment is upgraded. Upgrading an infrastructure may include, for example, adding a reserve power system, adding a UPS, or adding a mechanical cooling system.

In some embodiments, a data center is pre-configured so that portions of the data center can be converted from one operating environment to another operating environment. Pre-configuration may include infrastructure elements for switching, upgrading, or streamlining an environment. In various embodiments, pre-configuring a data center may include providing electrical power lines or cooling provisions. Examples of power lines may include bus bars, cabling, or network ports. Examples of cooling air provisions include air ducts, chilled water lines, cooling system control lines, and cooling system power lines. Conversion from one environment to another may be done on a pod-by-pod basis, a module-by-module basis, a rack row by rack row basis, or rack system by rack system basis.

In some embodiments, a data center includes infrastructure elements for re-configuring a portion of a data center to meet a more stringent set of infrastructure specifications. In one embodiment, the infrastructure elements may be used to add reserve power, a UPS, or both. In certain embodiments, rows of racks or pods in a data center are converted to allow re-assignment of rack computing systems in a data center to perform different services. Rows of rack may be converted, for example, from the base environment shown on the right side of FIG. 7 to the full environment shown on the left side of FIG. 7.

In some embodiments, one or more parts of a data center are re-configured to provide a different service. Parts of a data center may be re-configured to increase or decrease the computing resources in a particular operating environment. Changes to operating environments in a data center may be based, for example, on changes in demand for services. For instance, if there is additional demand for a service that requires power redundancy, some of the rack rows in a data center that are not power redundant may be reconfigured to add power redundancy.

In various embodiments, the infrastructure elements for re-configuration are provided on a pod-by-pod basis, a module-by-module basis, a rack row by rack row basis, or rack system by rack system basis.

FIGS. 9A and 9B illustrate one embodiment of a data center with rows pre-configured for conversion from one operating environment to another operating environment. Data center 360 includes rack rows 362a and 362b. Although only one rack row is shown on each side of FIGS. 9A and 9B, a data center may include any number of rack rows, pods, or other groupings (see, for example, the arrangement of rows and columns shown in FIG. 5B.

Each of rack rows 362a and 362b includes rack computing systems similar to those described above relative to FIG. 5A and FIG. 5B. Each of rack rows 362a and 362b include primary power bus 364 and reserve power bus 366. Primary power bus 364 and reserve power bus 366 may include a panel connector or whip at the end of the row. In one embodiment, primary power bus 364 and reserve power bus 366 are supplied with power from a utility feed from a common set of power transformers and/or switchgear. In certain embodiments, a row of racks may provide for mounting of one or more bus bar or cabling for a row of racks. In one embodiment, a bus bar may be used to provide redundant power to a row of rack computing systems.

Each of rack rows 362a and 362b includes chilled water pipes 368 (only one pipe is shown for clarity in FIGS. 9A and 9B), mechanical cooling power lines 370, and mechanical cooling control lines 372. Chilled water pipes 368, mechanical cooling power lines 370, and mechanical cooling control lines 372 may terminate at or in mechanical cooling cell 374. Chilled water pipes 368 may be, in some embodiments, supplied from a central water chilling system, either in the data center or external to the data center). Mechanical cooling power lines 370 may supply electrical power from a power distribution system for data center 360.

Mechanical cooling control lines 370 may be coupled to a control system in data center 360.

In FIG. 9A, rack computing systems in rack row 362a may be provided with redundant power and mechanical cooling. Rack computing systems in rack row 362b may have only a single power source and may not receive mechanical cooling. Each of rack rows 362a and 362b may be used to provide different services. Rack row 362a includes mechanical cooling unit 380, UPS 382, and automatic transfer switch 384. Automatic transfer switch 384 may control power to rack power distribution cables 386. Automatic transfer switch 384 may switch power to the rack computing systems in rack row 362a between a primary power source fed through primary power bus 364 and reserve power bus 366.

In rack row 362b, air passes through mechanical cooling cell 374 without any active cooling. Rack distribution cables 390 may be coupled directly to primary power bus 364. The connection to primary power bus may be, for example, through a panel connector or power whip.

In FIG. 9B illustrates an embodiment in which a rack row has been converted to include redundant power and mechanical cooling. In FIG. 9B, automatic transfer switch 384 has been installed to provide redundant power to rack computing systems in rack row 362b. UPS 384 has been installed to provide an uninterruptible power source to rack computing systems in rack row 362b. Mechanical cooling unit 380 has been installed in mechanical cooling cell 374 to provide mechanical cooling for rack computing systems in rack row 362b. After conversion, the rack computing systems in rack row 362b may be used to provide different services than before the conversion. In one embodiment, the rack computing systems in rack row 362b are used after conversion to provide the same services as those provided by the rack computing systems in rack row 362a.

Although in the embodiments shown in FIG. 7 and FIG. 8, a data center includes two levels of operating environments, supported by two different infrastructures, a data center may include any number of different levels of operating environments and any number of different infrastructures. Each of the operating environments may be used to provide a different service, or a different level of service, from the other operating environments in the data center.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a plurality of rack computing systems, wherein at least one of the rack computing systems comprises a rack and two or more computing devices mounted in the rack, and wherein the plurality of rack computing systems are arranged in a plurality of sets of the rack computing systems;
   a plurality of hot aisles, wherein each hot aisle of the plurality of hot aisles is arranged adjacent to a respective set of the rack computing systems, wherein the plurality of hot aisles comprise one or more chambers, wherein each of the one or more chambers comprises one or more walls having one or more openings arranged to receive the respective set of the rack computing systems, wherein the respective set of the rack computing systems is arranged in contact with a perimeter of the one or more openings to seal air between the respective set of the rack computing systems and the one or more chambers, wherein the one or more walls are arranged to segregate air in at least one of the hot aisles from other air in the data center; and
   an air handling system comprising:
     a plurality of air moving devices external to the rack computing systems and arranged to create a negative pressure in each of the hot aisles relative to ambient air at one or more air inlets to at least one rack of the respective sets of the rack computing systems, wherein the negative pressure draws air from the air inlets via respective openings of respective walls to the respective one or more chambers of the respective hot aisles through at least one of the two or more computing devices in the at least one rack, wherein the drawn air free-cools the at least one computing device, wherein the drawn air is heated by the at least one computing device;
     a plurality of ducts coupled to the plurality of air moving devices, wherein the plurality of air moving devices is arranged to draw the heated drawn air from the plurality of hot aisles to the plurality of ducts, wherein the plurality of air moving devices is arranged to expel from the data center at least a portion of the heated drawn air in the plurality of hot aisles via the plurality of ducts;
     one or more recirculation plenums configured to receive at least a portion of the air, wherein the one or more recirculation plenums are arranged to recirculate the at least a portion of the air; and
     a mixing plenum comprising one or more dampers between the one or more recirculation plenums and one or more outside air plenums, the mixing plenum configured to mix the recirculated air with outside air from the one or more outside air plenums.

2. The data center of claim 1, further comprising a direct evaporative cooling system arranged to cool at least a portion of the air before the air is drawn through at least some of the computing devices.

3. The data center of claim 2, wherein the air handling system is arranged to selectively bypass the direct evaporative cooling system.

4. The data center of claim 1, wherein the air handling system is arranged to recirculate at least a portion of the air through one or more of the racks.

5. The data center of claim 1, further comprising a chilled water subsystem arranged to provide chilled water to air handling system to cool at least a portion of the air before the air is drawn through at least some of the computing devices.

6. The data center of claim 1, wherein one of the air moving devices is above the hot aisle.

7. The data center of claim 1, wherein at least a portion of the air handling system and at least some of the two or more rack computing systems are contained in a pod.

8. The data center of claim 1, wherein the air handling system comprises a roof air exhaust coupled to at least one duct of the plurality of ducts.

9. A data center, comprising:
   two or more rack computing systems, wherein at least one of the rack computing systems comprises a rack and two or more computing devices mounted in the rack, and wherein the two or more rack computing systems are arranged in a plurality of sets of the rack computing systems;
   a plurality of chambers arranged to segregate air that is in each of the plurality of chambers from other air in the data center, wherein each of the chambers comprises one or more walls having openings arranged to receive respective sets of the rack computing systems, wherein the openings are coupled to the respective sets of the rack computing systems to seal air between the respective sets of the rack computing systems and the plurality chambers; and an air handling system comprising:

a plurality of air moving devices external to the two or more rack computing systems, wherein at least one of the air moving devices is arranged to create a negative pressure in each of the plurality of chambers relative to ambient air at one or more air inlets to at least one rack of the respective sets of the rack computing systems, wherein the negative pressure draws air from the air inlets via respective openings of respective walls to at least one of the plurality of chambers through at least one of the two or more computing devices in the at least one rack, wherein the drawn air is heated by the at least one computing device;

a plurality of ducts coupled to the plurality of air moving devices, wherein the plurality of air moving devices is arranged to draw the heated drawn air from the plurality of hot aisles to the plurality of ducts, wherein the plurality of air moving devices is arranged to expel from the data center at least a portion of the heated drawn air in the plurality of hot aisles via the plurality of ducts;

one or more recirculation plenums configured to receive at least a portion of the air, wherein the one or more recirculation plenums are arranged to recirculate the at least a portion of the air; and a mixing plenum comprising one or more dampers between the one or more recirculation plenums and one or more outside air plenums, the mixing plenum configured to mix the recirculated air with outside air from the one or more outside air plenums.

10. The data center of claim 9, further comprising one or more air moving devices upstream from at least one of the rack computing systems.

11. The data center of claim 9, further comprising a direct evaporative cooling system arranged to cool at least a portion of the air before the air is drawn through at least some of the computing devices.

12. The data center of claim 11, wherein the air handling system is arranged to selectively bypass the direct evaporative cooling system.

13. The data center of claim 9, wherein the air comprises at least some outside air and further comprising one or more filters arranged to filter the outside air before the air is drawn through at least some of the computing devices.

14. The data center of claim 9, wherein at least one of the one or more air moving devices is arranged to draw air through at least one row of racks at a rate of at least 3,000 cubic feet per minute.

15. The data center of claim 9, wherein the air handling system further comprises one or more recirculation ducts arranged to recirculate at least a portion of the air through one or more of the racks.

16. The data center of claim 9, wherein the air handling system further comprises:

one or more temperature measurement devices in the mixing plenum configured to measure a temperature of mixed air in the mixing plenum.

17. The data center of claim 9, wherein the air handling system comprises one or more air removal systems, wherein each of at least one of the air removal systems comprises a row of two or more air moving devices.

18. The data center of claim 9, wherein the air handling system comprises one or more air removal systems, wherein at least one of the one or more air removal systems comprise one of the at least one air moving devices arranged to draw air through computing devices in a particular one of the racks.

19. The data center of claim 18, wherein two of the at least one air moving devices in at least one of the air removal systems are arranged to draw air through computing devices in a different one of the racks than another one of the two air moving devices, wherein at least one of the two air moving devices is separately controllable from at least one other of the two air moving devices.

20. The data center of claim 9, wherein the air handling system comprises one or more air removal systems, wherein at least one of the one or more air removal system comprises one of the at least one air moving devices arranged to draw air through computing devices in two or more of the racks.

21. The data center of claim 9, further comprising one or more hot aisles, wherein the air handling system comprises one or more air removal systems comprising at least one of the at least one air moving devices, wherein one of the air moving devices of one of the air removal systems is above at least one of the hot aisles.

22. The data center of claim 9, further comprising one or more hot aisles, wherein at least one of the hot aisles is at least partially contained by one or more walls of the plurality of chambers.

23. The data center of claim 22, wherein at least one of the rack computing systems is movable to couple with the at least one hot aisle.

24. The data center of claim 22, further comprising a plurality of seal elements along respective perimeters of respective openings of the one or more walls to at least partially seal in cooling air as the air passes from at least one of the racks to the at least one hot aisle.

25. The data center of claim 9, wherein the two or more rack computing systems comprise a first row of rack computing systems and a second row of rack computing systems, the data center further comprising:

a cold aisle between the first row of rack computing systems and the second row of rack computing systems;

a first hot aisle on the opposite side of first row of rack computing systems from the cold aisle; and a second hot aisle on the opposite side of second row of rack computing systems from the cold aisle, wherein one of the air moving devices of the at least one of the air moving devices is arranged to create the negative pressure in at least one of the hot aisles to draw air in the cold aisle to the at least one of the hot aisles through at least one row of rack computing systems.

26. The data center of claim 9, wherein at least a portion of the air handling system and at least some of the two or more rack computing systems are contained in a pod.

27. The data center of claim 9, wherein the air handling system comprises a roof air intake.

28. The data center of claim 9, wherein the air handling system comprises a roof air exhaust, and wherein the one or more air moving devices are further arranged to expel the drawn air via the roof air exhaust.

29. The data center of claim 9, wherein the air handling system further comprises a controller arranged to control a temperature in at least one location in the data center.

30. The data center of claim 29, wherein the air handling system further comprises:
one or more sensors arranged to sense at least one characteristic of air in the at least one location in the data center, wherein the controller is arranged to control the temperature in the at least one location in the data center based, at least in part, on the at least one characteristic of the air sensed by the one or more sensors.

31. A method of cooling electrical systems in a data center, comprising:
creating a negative pressure in respective chambers of a plurality of hot aisles relative to ambient air at one or more air inlets to sets of racks in contact with one or more walls of the respective chambers, wherein the chamber of the hot aisle segregates air in the hot aisle from other air in the data center, and wherein each of the hot aisles corresponds to a respective set of racks;
drawing air from the one or more air inlets via one or more openings of the one or more walls to one or more ducts above the plurality of hot aisles and through one or more computing devices in at least one rack of each of the sets of racks into the respective chamber of the respective hot aisle to free cool the computing devices to remove heat from heat producing components in the computing devices, wherein the drawn air is heated by the heat producing components;
expelling, from the data center via the one or more ducts, the heated drawn air;
recirculating at least a portion of the air after the air has been heated by the heat producing components in the computing devices via one or more recirculation plenums; and
mixing the recirculated air with outside air from one or more outside air plenums at a mixing plenum comprising one or more dampers between the one or more recirculation plenums and one or more outside air plenums.

32. The method of claim 31, wherein said creating a negative pressure in the chamber of the hot aisle relative to ambient air at the one or more air inlets comprises creating the negative pressure in the chamber of the hot aisle adjacent to at least one of the racks.

33. The method of claim 31, further comprising evaporating a liquid into at least a portion of the air before the air is drawn through at least some of the computing devices.

34. The method of claim 31, further comprising:
modulating airflow in the data center based at least in part on opening or closing the one or more dampers.

* * * * *